(12) United States Patent
Zhang et al.

(10) Patent No.: US 12,058,917 B2
(45) Date of Patent: Aug. 6, 2024

(54) OLED DISPLAY PANEL

(71) Applicant: Wuhan China Star Optoelectronics Semiconductor Display Technology Co., Ltd., Hubei (CN)

(72) Inventors: Ming Zhang, Hubei (CN); Jie Yang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/421,400

(22) PCT Filed: Jun. 4, 2021

(86) PCT No.: PCT/CN2021/098287
§ 371 (c)(1),
(2) Date: Jul. 8, 2021

(87) PCT Pub. No.: WO2022/246893
PCT Pub. Date: Dec. 1, 2022

(65) Prior Publication Data
US 2024/0023408 A1    Jan. 18, 2024

(30) Foreign Application Priority Data

May 27, 2021 (CN) .......................... 202110584518.4

(51) Int. Cl.
*H10K 59/80* (2023.01)
*H10K 59/124* (2023.01)

(52) U.S. Cl.
CPC .......... *H10K 59/873* (2023.02); *H10K 59/124* (2023.02)

(58) Field of Classification Search
CPC .. H10K 59/873; H10K 59/124; H10K 71/231; H01K 59/1201
See application file for complete search history.

(56) References Cited

U.S. PATENT DOCUMENTS

| 2018/0088390 | A1  | 3/2018 | Ohara |
| 2020/0083475 | A1* | 3/2020 | Kang ..................... H10K 50/84 |
| 2020/0127233 | A1* | 4/2020 | Sung .................... H10K 77/111 |

(Continued)

FOREIGN PATENT DOCUMENTS

| CN | 107180923 | 9/2017 |
| CN | 107799564 | 3/2018 |
| CN | 109638019 | 4/2019 |

(Continued)

*Primary Examiner* — Evan G Clinton

(57) ABSTRACT

A display panel disclosed by the present application includes a substrate, and the substrate includes a display region and a non-display region. An aperture is defined in the display region. A first recess is defined in the non-display region. A second recess is defined in a periphery of the aperture. An organic light emitting material layer is disposed on the substrate, portions of the organic light emitting material layer corresponding to the first recess and the second recess are broken off. An encapsulation layer is disposed on the organic light emitting material layer, a portion of the encapsulation layer corresponding to the first recess is broken off, and a portion of the encapsulation layer corresponding to the second recess is continuous.

18 Claims, 7 Drawing Sheets

(56) References Cited

U.S. PATENT DOCUMENTS

2022/0020957 A1* 1/2022 Choi .................. H10K 59/8731

FOREIGN PATENT DOCUMENTS

| | | | | |
|---|---|---|---|---|
| CN | 109638019 A | * | 4/2019 | ........... H01L 23/562 |
| CN | 110459700 | | 11/2019 | |
| CN | 110473983 | | 11/2019 | |
| CN | 110634928 | | 12/2019 | |
| CN | 110660832 | | 1/2020 | |
| CN | 111463361 | | 7/2020 | |
| CN | 112447924 | | 3/2021 | |
| CN | 112736093 | | 4/2021 | |

* cited by examiner

OLED DISPLAY PANEL

RELATED APPLICATIONS

This application is a National Phase of PCT Patent Application No. PCT/CN2021/098287 having International filing date of Jun. 4, 2021, which claims the benefit of priority of Chinese Patent Application No. 202110584518.4 filed on May 27, 2021. The contents of the above applications are all incorporated by reference as if fully set forth herein in their entirety.

FIELD AND BACKGROUND OF THE INVENTION

The present application relates to a field of displays, especially to an organic light emitting diode (OLED) display panel.

With continuous development of display technology, organic light emitting diode (OLED) has gradually become the mainstream of the display field due to its excellent performance such as self-luminescence, high contrast, wide viewing angle, low power consumption, and flexibility.

To meet relatively high resolution requirements of electronic products, OLED display panels are produced by evaporation. A mask plate used for evaporation is an important expense.

To efficiently employ the mask plate to reduce costs, OLED display panels with similar shapes currently share a mask plate. However, due to inconsistent film layer thicknesses of the OLED display panels at an edge of a display region, cracks easily occur during cutting, which further influences an encapsulation effect of the OLED display panels.

SUMMARY OF THE INVENTION

The present application provides an OLED display panel that is able to prevent cracks generated during cutting to further improve an encapsulation effect of the OLED display panel.

In a first aspect, the present application provides an organic light emitting diode (OLED) display panel, comprising:
  a substrate, wherein the substrate comprises a display region and a non-display region disposed outside the display region, and an aperture is defined in the display region; wherein a first recess is defined in the non-display region, and a second recess is defined in a periphery of the aperture and is located between the aperture and the display region;
  an organic light emitting material layer, wherein the organic light emitting material layer is disposed on the substrate, and portions of the organic light emitting material layer corresponding to the first recess and the second recess are broken off; and
  an encapsulation layer, wherein the encapsulation layer is disposed on the organic light emitting material layer, a portion of the encapsulation layer corresponding to the first recess is broken off, and a portion of the encapsulation layer corresponding to the second recess is continuous.

In the OLED display panel provided by the present application, the substrate comprises a base and an insulation layer disposed on the base;
  a first sub-recess is defined in the base, a first via hole is defined in the insulation layer, and the first sub-recess and the first via hole are arranged correspondingly to form the first recess; and
  a second sub-recess is defined in the base, a second via hole is defined in the insulation layer, and the second sub-recess and the second via hole are arranged correspondingly to form the second recess.

In the OLED display panel provided by the present application, the insulation layer comprises a first extension portion, the first extension portion is disposed right above the first sub-recess, and a ratio of a length of the first extension portion to a depth of the first sub-recess is greater than 1.

In the OLED display panel provided by the present application, a third sub-recess is defined in a bottom wall of the first sub-recess, and an opening of the third sub-recess is smaller than an opening of the first sub-recess.

In the OLED display panel provided by the present application, an included angle between a bottom wall of the first sub-recess and a sidewall of the first sub-recess is an acute angle.

In the OLED display panel provided by the present application, the insulation layer comprises a second extension portion, the second extension portion is disposed right above the second sub-recess, and a ratio of a length of the second extension portion to a depth of the second sub-recess ranges from 0.3 to 0.4.

In the OLED display panel provided by the present application, an included angle between the second extension portion and a sidewall of the second sub-recess ranges from 75 degrees to 180 degrees.

In the OLED display panel provided by the present application, the length of the second extension portion is 1 micron, and the depth of the second sub-recess is 3 microns.

In the OLED display panel provided by the present application, the transistor layer comprises a first insulation layer, an active layer, a second insulation layer, a gate electrode, a third insulation layer, a source electrode/drain electrode, and a fourth insulation layer sequentially stacked on one another; wherein the insulation layer comprises the first insulation layer, the second insulation layer, and the third insulation layer.

In the OLED display panel provided by the present application, a barrier wall structure is disposed on the periphery of the aperture; a number of the second recess located on a side of the barrier wall structure away from the first recess is greater than or equal to 1, and a number of the second recess located on a side of the barrier wall structure near the first recess is greater than or equal to 3.

In the first aspect, the present application provides an organic light emitting diode (OLED) display panel, comprising:
  a substrate, wherein the substrate comprises a display region and a non-display region disposed outside the display region, and an aperture is defined in the display region; wherein a first recess is defined in the non-display region, and a second recess is defined in a periphery of the aperture and is located between the aperture and the display region;
  an organic light emitting material layer, wherein the organic light emitting material layer is disposed on the substrate, and portions of the organic light emitting material layer corresponding to the first recess and the second recess are broken off; and
  an encapsulation layer, wherein the encapsulation layer is disposed on the organic light emitting material layer, a portion of the encapsulation layer corresponding to the first recess is broken off, and a portion of the encapsulation layer corresponding to the second recess is continuous;

wherein the substrate comprises a base and an insulation layer disposed on the base;

wherein a first sub-recess is defined in the base, a first via hole is defined in the insulation layer, and the first sub-recess and the first via hole are arranged correspondingly to form the first recess;

wherein a second sub-recess is defined in the base, a second via hole is defined in the insulation layer, and the second sub-recess and the second via hole are arranged correspondingly to form the second recess; and wherein a barrier wall structure is disposed on the periphery of the aperture; a number of the second recess located on a side of the barrier wall structure away from the first recess is greater than or equal to 1, and a number of the second recess located on a side of the barrier wall structure near the first recess is greater than or equal to 3.

In the OLED display panel provided by the present application, the insulation layer comprises a first extension portion, the first extension portion is disposed right above the first sub-recess, and a ratio of a length of the first extension portion to a depth of the first sub-recess is greater than 1.

In the OLED display panel provided by the present application, a third sub-recess is defined in a bottom wall of the first sub-recess, and an opening of the third sub-recess is smaller than an opening of the first sub-recess.

In the OLED display panel provided by the present application, an included angle between a bottom wall of the first sub-recess and a sidewall of the first sub-recess is an acute angle.

In the OLED display panel provided by the present application, the insulation layer comprises a second extension portion, the second extension portion is disposed right above the second sub-recess, and a ratio of a length of the second extension portion to a depth of the second sub-recess ranges from 0.3 to 0.4.

In the OLED display panel provided by the present application, an included angle between the second extension portion and a sidewall of the second sub-recess ranges from 75 degrees to 180 degrees.

In the OLED display panel provided by the present application, the length of the second extension portion is 1 micron, and the depth of the second sub-recess is 3 microns.

In the OLED display panel provided by the present application, the transistor layer comprises a first insulation layer, an active layer, a second insulation layer, a gate electrode, a third insulation layer, a source electrode/drain electrode, and a fourth insulation layer sequentially stacked on one another; wherein the insulation layer comprises the first insulation layer, the second insulation layer, and the third insulation layer.

The OLED display panel provided by the present application, defines a first recess and a second recess in a non-display region, and has portions of each of an organic light emitting material layer and an encapsulation layer broken off in the first recess and the second recess, or has the encapsulation layer broken off in the first recess and continuous in the second recess such that cracks can be cut during cutting and repairing. Namely, when OLED display panels with similar shapes commonly employ a mask plate, cracks extending toward a display region are prevented from being easily generated during cutting, which further improves an encapsulation effect of the OLED display panels.

BRIEF DESCRIPTION OF THE SEVERAL VIEWS OF THE DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DESCRIPTION OF SPECIFIC EMBODIMENTS OF THE INVENTION

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application. In addition, the terms "first", "second", etc. in the specification and claims of the present application are used to distinguish different objects, rather than to describe a specific order.

Figure 1A:
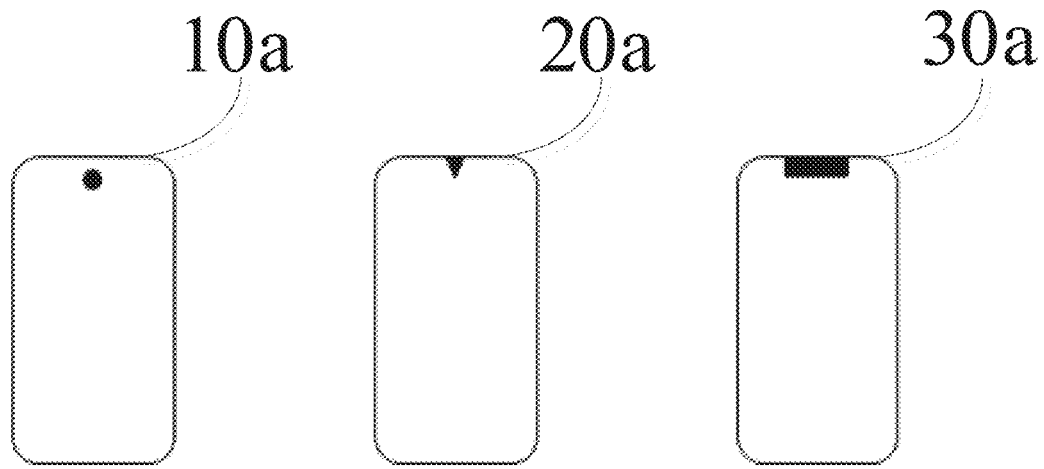
FIG. 1a is a schematic structural view of first organic light emitting diode (OLED) display panels with a similar shape.
Figure 1B:
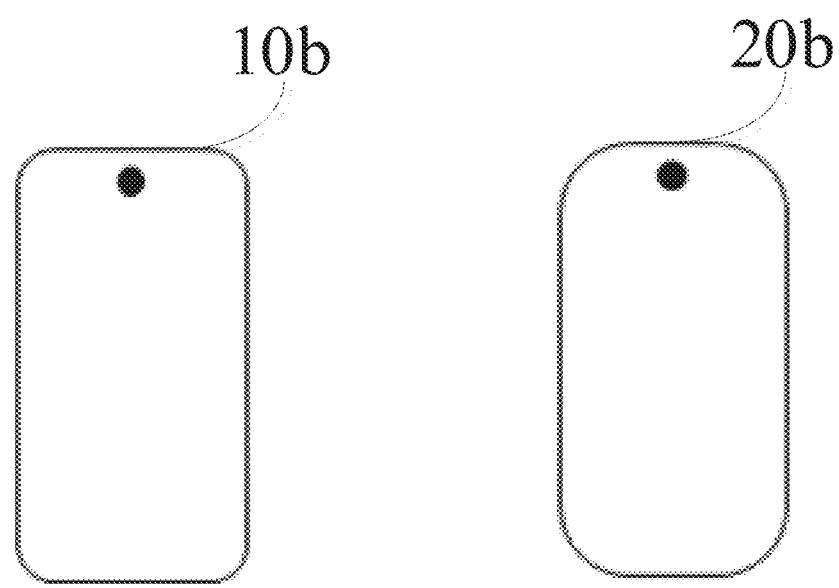
FIG. 1b is a schematic structural view of second OLED display panels with the similar shape.

With reference to FIG. 1a, FIG. 1a is a schematic structural view of first organic light emitting diode (OLED)

display panels with a similar shape. As shown in FIG. 1a, the OLED display panel 10a, the OLED display panel 20a, and the OLED display panel 30a are display panels with similar shapes. The OLED display panel 10a is the display panel forming holes in a display region. The OLED display panel 20a and the OLED display panel 30a are the display panels forming holes in an edge of the display regions. With reference to FIG. 1b, FIG. 1b is a schematic structural view of second OLED display panels with the similar shape. As shown in FIG. 1b, the OLED display panel 10b and the OLED display panel 20b are display panels with similar shapes. A difference is between edges of the display regions of the OLED display panel 10b and the OLED display panel 20b.

With reference to FIGS. 1a and 1b, to efficiently use a mask plate to lower cost, OLED display panels with similar shapes can share a mask plate. However, because film layer thicknesses of the OLED display panels on an edge of the display region are uneven, cracks are easily generated when a shape of the OLED display panels is trimmed and cut, which further affects an encapsulation effect of the OLED display panels.

As such, the present application provides a display panel comprising a substrate, wherein the substrate comprises a display region and a non-display region disposed outside of the display region; a first recess defined in the non-display region; an organic light emitting material layer, wherein the organic light emitting material layer is disposed on the substrate, and a portion of the organic light emitting material layer corresponding to the first recess is broken off; and an encapsulation layer, wherein the encapsulation layer is disposed on the organic light emitting material layer, and a portion of the encapsulation layer corresponding to the first recess is broken off.

Because the OLED display panel provided by the present application defines the first recess in the non-display region, and both the portions of the organic light emitting material layer and the encapsulation layer corresponding to the first recess are broken off, cutting cracks can be interrupted when the shape is trimmed and cut. Namely, when OLED display panels with similar shapes commonly employ a mask plate, cracks extending toward a display region are prevented from being easily generated during cutting, which further improves an encapsulation effect of the OLED display panels.

Figure 2:
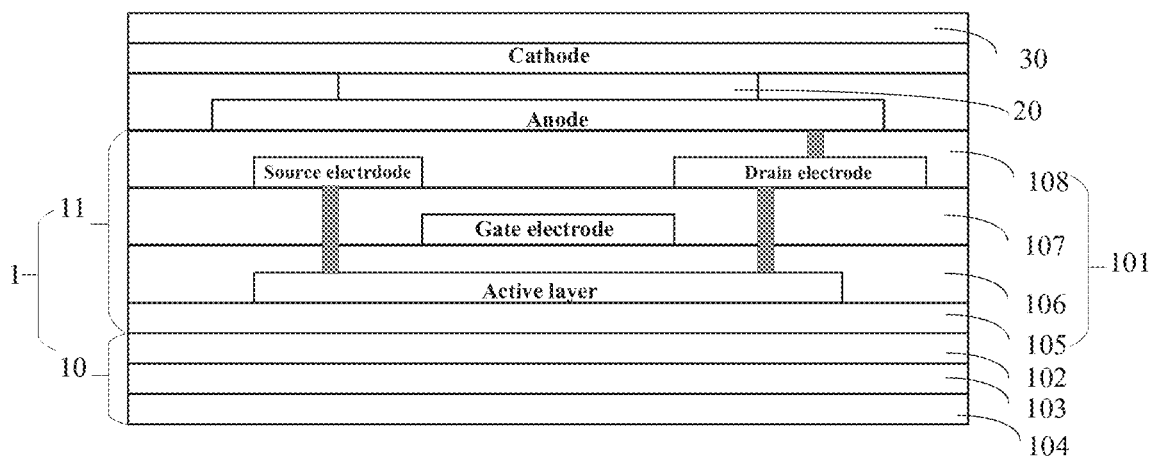
FIG. 2 is a schematic entire structural view of an OLED display panel provided by an embodiment of the present application.

With reference to FIG. 2, FIG. 2 is a schematic entire structural view of an OLED display panel provided by an embodiment of the present application. As shown in FIG. 2, the OLED display panel 100 provided by the embodiment of the present application comprises a substrate 1, an anode, a light emitting material layer 20, a cathode, and an encapsulation layer sequentially stacked on one another. The substrate 1 comprises a base 10 and a transistor layer 11 sequentially stacked on each other. The transistor layer 11 comprises a first insulation layer 105, an active layer, a second insulation layer 106, a gate electrode, a third insulation layer 107, a source electrode/drain electrode, and a fourth insulation layer 108 sequentially stacked on one another. Namely, an insulation layer 101 comprises the first insulation layer 105, the second insulation layer 106, the third insulation layer 107, and the fourth insulation layer 108 sequentially stacked on one another.

Figure 3:
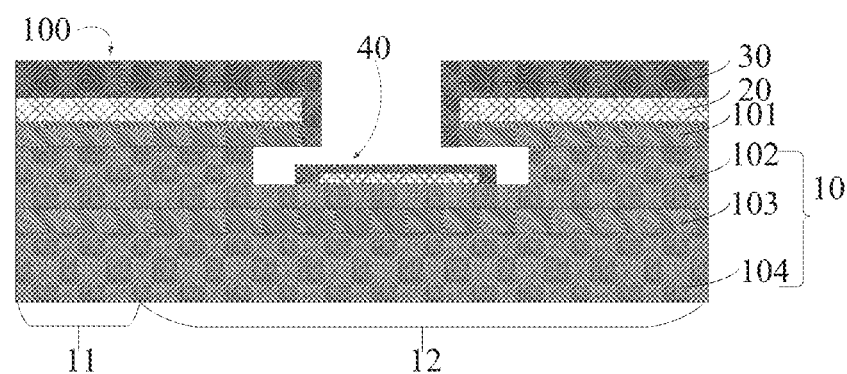
FIG. 3 is a first schematic structural view of the OLED display panel provided by the embodiment of the present application.

Specifically, with reference to FIG. 3, FIG. 3 is a first schematic structural view of the OLED display panel provided by the embodiment of the present application. As shown in FIG. 3, the OLED display panel 100 provided by the embodiment of the present application comprises the base 10, an organic light emitting material layer 20, and the encapsulation layer 30. The base 10 comprises a display region 11 and a non-display region 12 disposed outside the display region 11. A first recess 40 is defined in the non-display region 12. The organic light emitting material layer 20 is disposed on the base 10, and a portion of the organic light emitting material layer 20 corresponding to the first recess 40 is broken off. The encapsulation layer 30 is disposed on the organic light emitting material 20 layer, and a portion of the encapsulation layer 30 corresponding to the first recess 40 is broken off.

It should be explained that the organic light emitting material layer 20 and the encapsulation layer 30 are disposed correspondingly in the display region 11, and extend to the non-display region 12. Namely, in the embodiment of the present application, the organic light emitting material layer and the encapsulation layer 30 are disposed in both the display region 11 and the non-display region 12.

Specifically, the base 10 can be a rigid base or a flexible base. The rigid base can be a glass base, etc. The flexible base can be a structure including a single-layer or multi-layer flexible base film. The flexible base can employ flexible base material such as polyimide, polyethylene terephthalate, polybutylene naphthalate, or polycarbonate, and can be material such as metal foil.

In the embodiment of the present application, the base 10 is a structure of multi-layer flexible base film. The base 10 comprises a first base 102, a fifth insulation layer 103, and a second base 104 sequentially stacked on one another. Material of the first base 102 can be the same as material of the second base 104. For example, both material of the first base 102 and material of the second base 104 are polyimide. Polyimide has advantages such as excellent thermal stability, chemical resistance, and mechanical characteristics, and can guarantee a longer lifespan of use. Material of the fifth insulation layer 103 is silicon nitride material or silicon oxide material. Since silicon nitride material or silicon oxide material has good water resistance, it effectively blocks external moisture, oxygen, and corrosive substances, thereby ensuring the water and oxygen resistance of the substrate.

Specifically, the organic light emitting material layer 20 can comprise a red organic light emitting material, a green organic light emitting material, or a blue organic light emitting material for a light emitting pixel, and can comprise a common functional layer material (for example: electron transport material, hole block material, hole transport material, electron block material, etc.) disposed on an entire surface. In the present embodiment, a portion of the common functional layer material corresponding to the first recess is broken off, and a portion of the common functional layer material corresponding to the second recess 60 is also broken off. The encapsulation layer 30 comprises at least one organic layer and at least one inorganic layer stacked alternately (for example, a three-layer stacked structure comprising the inorganic layer, the organic layer, and the inorganic layer). Disposing the organic layer and the inorganic layer blocks out most external water, and simultaneously flattens the encapsulation layer, which improves an encapsulation effect of the encapsulation layer.

Figure 4:
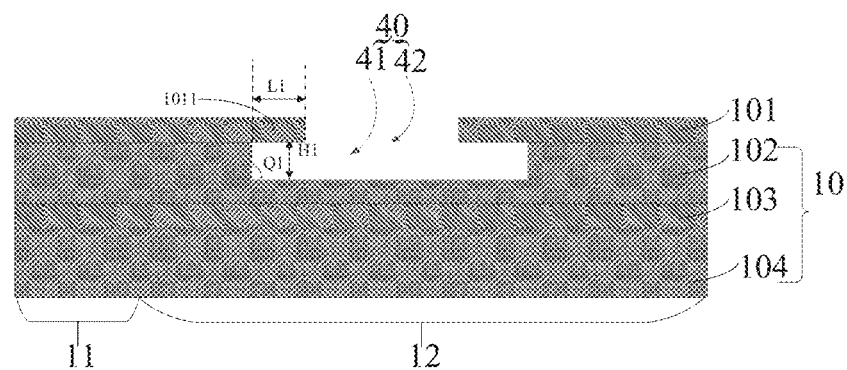
FIG. 4 is a schematic structural view of a substrate of the OLED display panel as shown in FIG. 3.

Furthermore, with reference to FIG. 4, FIG. 4 is a schematic structural view of a substrate of the OLED display panel as shown in FIG. 3. As shown in FIG. 4, a first sub-recess 41 is defined in the first base 102. A first via hole 42 is defined in the insulation layer 101. The first sub-recess 41 and the first via hole 42 are arranged correspondingly to form the first recess 40. It can be understood that an opening of the first sub-recess 41 is larger than an opening of the first via hole 42. Namely, an inner profile of the first recess 40 is protrusion-shaped.

The insulation layer 101 comprises a first extension portion 1011. The first extension portion 1011 is disposed right above the first sub-recess 41, and a ratio of a length L1 of the first extension portion 1011 to a depth H1 of the first sub-recess 41 is greater than 1. An included angle between a bottom wall of the first sub-recess 41 and a sidewall of the first sub-recess 41 is a right angle. Specifically, first extension portions 1011 are disposed between two sides of the first via hole 42 respectively, and the first extension portions 1011 located on the two sides of the first via hole 42 are disposed symmetrically.

With reference to FIGS. 3 and 4, because the first recess 40 is defined, the portions of the organic light emitting material layer 20 and the encapsulation layer 30 corresponding to the first recess 40 are broken off when the organic light emitting material layer 20 and the encapsulation layer 30 extend from the display region 11 to the non-display region 12, such that cutting cracks can be interrupted when the shape is trimmed and cut.

Figure 5:
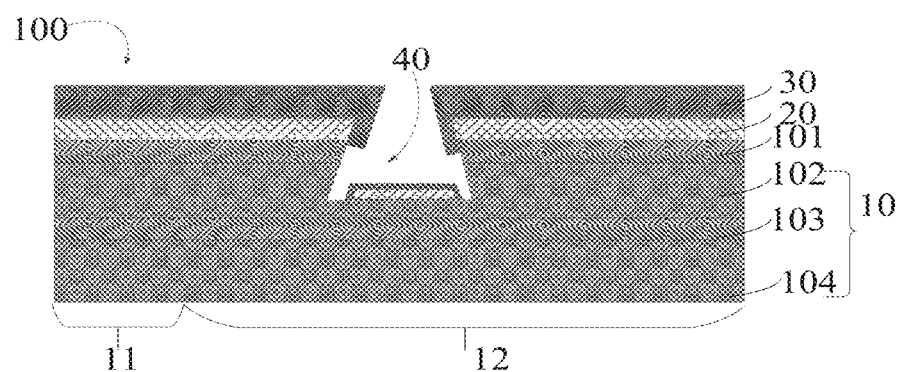
FIG. 5 is a second schematic structural view of the OLED display panel provided by the embodiment of the present application.
Figure 6:
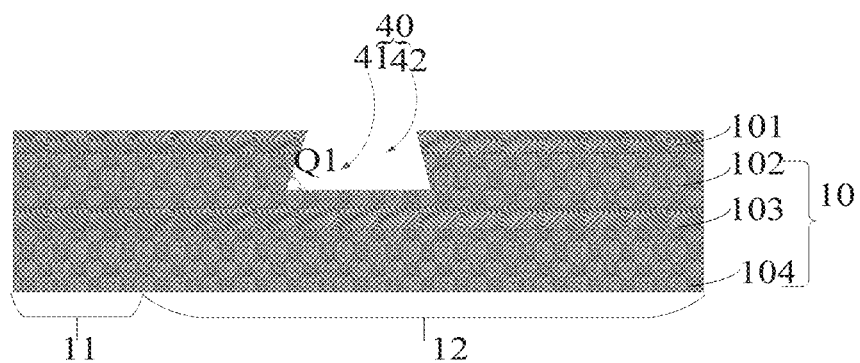
FIG. 6 is a schematic structural view of the substrate of the OLED display panel as shown in FIG. 5.

With reference to FIGS. 5 and 6, FIG. 5 is a second schematic structural view of the OLED display panel provided by the embodiment of the present application. FIG. 6 is a schematic structural view of the substrate of the OLED display panel as shown in FIG. 5. A difference of the OLED display panel 100 as shown in FIGS. 5 and 6 from the OLED display panel 100 as shown in FIG. 3 is that: in the OLED display panel 100 shown in FIG. 3, the included angle Q1 between the bottom wall of the first sub-recess 41 and the sidewall of the first sub-recess 41 is a right angle. In the OLED display panel 100 as shown in FIGS. 5 and 6, the included angle Q1 between the bottom wall of the first sub-recess 41 and the sidewall of the first sub-recess 41 is an acute angle.

With reference to FIG. 6, the first sub-recess 41 is defined on the first base 102. The first via hole 42 is defined on the insulation layer 101. The first sub-recess 41 and the first via hole 42 are defined correspondingly to form the first recess 40. It can be understood that an included angle between a sidewall of the first via hole 42 and the bottom wall of the first sub-recess 41 is equal to the included angle between the sidewall of the first sub-recess 41 and the bottom wall of the first sub-recess 41.

With reference to FIGS. 5 and 6, because the first recess 40 is defined, the portions of the organic light emitting material layer 20 and the encapsulation layer 30 corresponding to the first recess 40 are broken off when the organic light emitting material layer 20 and the encapsulation layer 30 extend from the display region 11 to the non-display region 12, such that cutting cracks can be interrupted when the shape is trimmed and cut.

Figure 7:
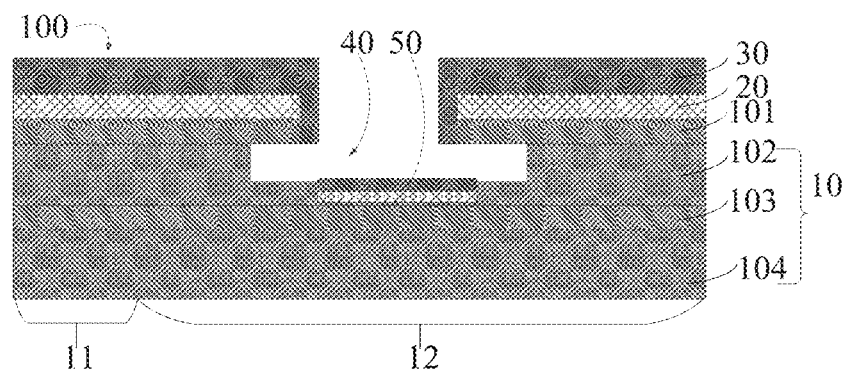
FIG. 7 is a third schematic structural view of the OLED display panel provided by the embodiment of the present application.
Figure 8:
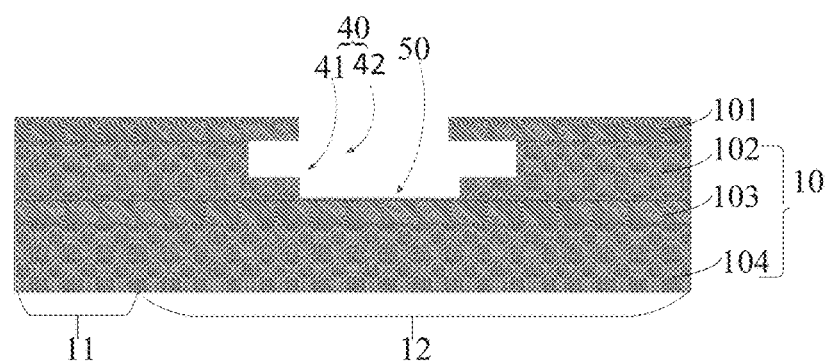
FIG. 8 is a schematic structural view of the substrate of the OLED display panel as shown in FIG. 7.

With reference to FIGS. 7 and 8, FIG. 7 is a third schematic structural view of the OLED display panel provided by the embodiment of the present application. FIG. 8 is a schematic structural view of the substrate of the OLED display panel as shown in FIG. 7. A difference of the OLED display panel 100 as shown in FIGS. 7 and 8 and the OLED display panel 100 as shown in FIG. 3 is that: in the OLED display panel 100 as shown in FIGS. 7 and 8, a third sub-recess 50 is defined in the bottom wall of the first sub-recess 41, and an opening of the third sub-recess 50 is smaller than an opening of the first sub-recess 40.

With reference to FIG. 8, the first sub-recess 41 is defined in the first base 102. The first via hole 42 is defined in the insulation layer 101. The first sub-recess 41 and the first via hole 42 are arranged correspondingly to form the first recess 40. The third sub-recess 50 is defined in the bottom wall of the first sub-recess 41, and the opening of the third sub-recess 50 is smaller than the opening of the first sub-recess 40.

With reference to FIGS. 7 and 8, the first recess 40 is defined such that the portions of the organic light emitting material layer 20 and the encapsulation layer 30 corresponding to the first recess 40 are broken off when the organic light emitting material layer 20 and the encapsulation layer 30 the display region 11 extend to the non-display region 12 to interrupt the cutting cracks when the shape is trimmed and cut.

Figure 9:
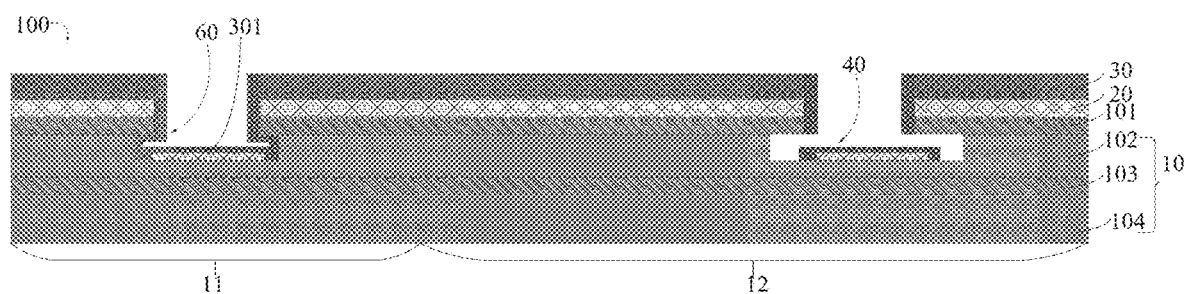
FIG. 9 is a fourth schematic structural view of the OLED display panel provided by the embodiment of the present application.

With reference to FIG. 9, FIG. 9 is a fourth schematic structural view of the OLED display panel provided by the embodiment of the present application. A difference of the OLED display panel 100 as shown in FIG. 9 from the OLED display panel 100 as shown in FIG. 3 is that: in the OLED display panel 100 as shown in FIG. 9, an aperture is defined in the display region 11, and a second recess 60 is defined in a periphery of the aperture. The second recess 60 is defined between the display region 11 and the first recess 40. The portion of the organic light emitting material layer 20 corresponding to the second recess 60 are broken off, and the portion of the encapsulation layer corresponding to the second recess 60 is continuous.

In a first aspect, in the OLED display panel 100 provided by the present application, because the first recess 40 is defined in the non-display region 12 and both the portions of the organic light emitting material layer 20 and the encapsulation layer 30 corresponding to the first recess 40 are broken off, the cutting cracks can be interrupted when the shape is trimmed and cut. Namely, when OLED display panels with similar shapes commonly employ a mask plate, cracks extending toward a display region are prevented from being easily generated during cutting, which further improves an encapsulation effect of the OLED display panel.

In a second aspect, in the OLED display panel 100 provided by the present application, a second recess 60 is further defined in the display region 11 and the first recess 40, a portion of the organic light emitting material layer 20 corresponding to the second recess 60 is broken off, and a portion of the encapsulation layer 30 corresponding to the second recess 60 is continuous, which can guarantee a lateral encapsulation effect of the OLED display panel.

Figure 10:
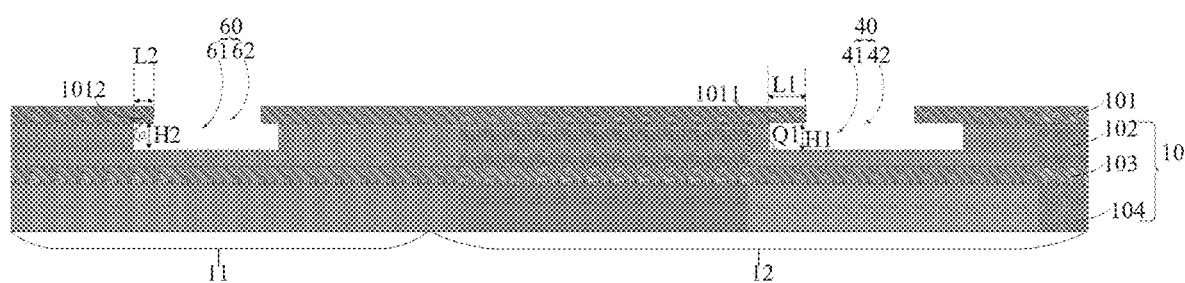
FIG. 10 is a schematic structural view of the substrate of the OLED display panel as shown in FIG. 9.

Specifically, With reference to FIG. 10, FIG. 10 is a schematic structural view of the substrate of the OLED display panel as shown in FIG. 9. As shown in FIG. 10, the first sub-recess 41 and a second sub-recess 61 are defined in the first base 102. The first via hole 42 and a second via hole 62 are defined in the insulation layer 101. The first sub-recess 41 and the first via hole 42 are arranged to form the first recess 40. The second sub-recess 61 and the second via hole 62 are arranged correspondingly to form the second recess 60. It can be understood that an opening of the first sub-recess 41 is larger than an opening of the first via hole 42. An opening of the second sub-recess 61 is larger than an opening of the second via hole 62. In other words, an inner profile of the first recess 40 is protrusion-shaped, and an inner profile of the second recess 60 is protrusion-shaped.

The insulation layer 101 comprises a first extension portion 1011. The first extension portion 1011 is disposed right above the first sub-recess 41, and the ratio of the length L1 of the first extension portion 1011 to the depth H1 of the first sub-recess 41 is greater than 1. An included angle Q1 between a bottom wall of the first sub-recess 41 and the sidewall of the first sub-recess 41 is a right angle. Specifically, the first extension portions 1011 are disposed on the two sides of the first via hole 42 respectively, and the first extension portions 1011 located the two sides of the first via hole 42 are disposed symmetrically.

The insulation layer 101 comprises a second extension portion 1012. The second extension portion 1012 is disposed right above the second sub-recess 61, and a ratio of a length L2 of the second extension portion 1012 to a depth H2 of the second sub-recess 61 ranges from 0.3 to 0.4. An included angle Q2 between the second extension portion 1012 and a sidewall of the second sub-recess 61 ranges from 75 degrees to 180 degrees. Specifically, the second extension portions 1012 are disposed on two sides of the second via hole 62 respectively, and the second extension portions 1012 on the two sides of the second via hole 62 are disposed symmetrically.

In an embodiment, the ratio of the length L2 of the second extension portion 1012 to the depth H2 of the second sub-recess 61 can be 0.33. In another embodiment, the ratio of the length L2 of the second extension portion 1012 to the depth H2 of the second sub-recess 61 can be 0.39. In still another embodiment, the ratio of the length L2 of the second extension portion 1012 to the depth H2 of the second sub-recess 61 can be 0.36. Specifically, the length L2 of the second extension portion 1012 is 1 micron, and the depth H2 of the second sub-recess 61 is 3 microns.

In an embodiment, the included angle Q2 between the second extension portion 1012 and the sidewall of the second sub-recess 61 can be 80 degrees. In another embodiment, the included angle Q2 between the second extension portion 1012 and the sidewall of the second sub-recess 61 can be 120 degrees. In another embodiment, the included angle Q2 between the second extension portion 1012 and the sidewall of the second sub-recess 61 can be 160 degrees.

With reference to FIGS. 9 and 10, because the first sub-recess 41 is defined, the portions of the organic light emitting material layer 20 and the encapsulation layer 30 corresponding to the first recess 40 are broken when the organic light emitting material layer 20 and the encapsulation layer 30 extend from the display region 11 to the non-display region 12, such that the cutting cracks can be interrupted when the shape is trimmed and cut. Because the second recess 60 is defined, the portion of the organic light emitting material layer 20 corresponding to the second recess 60 is broken off and the portion of the encapsulation layer 30 corresponding to the second recess 60 is continuous when the organic light emitting material layer 20 extends from the display region 11 to the non-display region 12.

Specifically, the encapsulation layer 30 comprises a connection portion 301, and the connection portion 301 covers the second sub-recess 61. Namely, the portion of the encapsulation layer 30 in the second recess 60 is connected through the connection portion 301.

Figure 11:
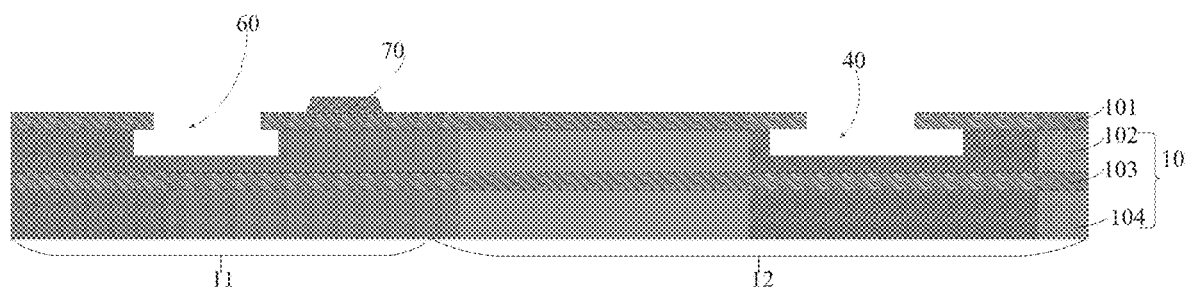
FIG. 11 is a fifth schematic structural view of the OLED display panel provided by the embodiment of the present application.

With reference to FIG. 11, FIG. 11 is a fifth schematic structural view of the OLED display panel provided by the embodiment of the present application. As shown in FIG. 11, a barrier wall structure 70 is further disposed in the non-display region 12. A number of the second recess 60 located on a side of the barrier wall structure 70 near the display region 11 is greater than or equal to 1. A number of the second recess 60 located on a side of the barrier wall structure 70 away from the display region 11 is greater than or equal to 3.

Specifically, the second recesses 60 defined in the non-display region 12 are arranged at intervals along a direction of the display region 11 facing the non-display region 12 to better prevent cracks generated during cutting from extending toward the display region 11, which further improves the encapsulation effect of the OLED display panel.

A product of a sum of a width of the first recess 40 and an interval between the adjacent first recesses 40 and a number of the first recesses 40 is greater than or equal to a predetermined cutting precision. It should be explained that that cutting precision means a cutting precision required for cutting performed on a region where the shape needs to be trimmed when the OLED display panels with the similar shapes share a mask plate. Furthermore, the display panel 100 is a cut display panel and would not leave a large number of the first recesses 40 in the non-display region 12, and remaining first recesses 40 probably fail to fulfill such relationship.

Figure 12:
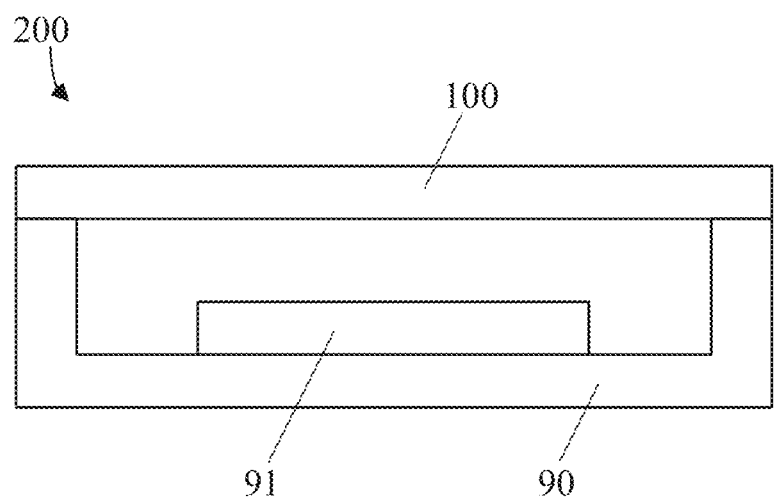
FIG. 12 is a schematic structural view of an electronic apparatus provided by the present application.

With reference to FIG. 12, FIG. 12 is a schematic structural view of an electronic apparatus provided by the present application. The electronic apparatus 200 can comprise the OLED display panel 100, a control circuit 91, and a casing 90. It should be explained that the electronic apparatus 200 as shown in FIG. 11 is not restricted by the above contents, and can also comprise other devices, for example, it can also comprise camera, antenna structure, fingerprint unlock module, etc.

The OLED display panel 100 is disposed on the casing 90. The OLED display panel can refer to the above description for details, and would not be described repeatedly here.

In some embodiments, the OLED display panel 100 can be fixed on the casing 90, and the OLED display panel 100 and the casing 90 form a hermetic space to accommodate devices such as the control circuit 91. In some embodiments, the casing 90 can be made of flexible material, for example, a plastic casing or a silicone casing.

The control circuit 91 is installed in the casing 90, and the control circuit 91 can be a mainboard of the electronic apparatus 200. The control circuit 91 can be integrated with one, two, or more of functional assemblies such as battery, antenna structure, microphone, speaker, headphone jack, universal serial bus interface, camera, distance sensor, ambient light sensor, receiver, and processor, and other functional components.

The OLED display panel 100 is installed in the casing 90, in the meantime, the OLED display panel 100 is electrically connected to the control circuit 91 to form a display surface of the electronic apparatus 200. The OLED display panel 100 can comprise a display region and a non-display region. The display region can be employed to display images of the electronic apparatus 200 or allow a user to implement a touch operation. The non-display region can be configured for disposing various functional assemblies.

The electronic apparatus comprises but is not limited to cell phones, tablet computers, computer monitors, game consoles, televisions, display screens, wearable devices, and other living appliances or household appliances with display functions, etc.

In a first aspect, because the OLED display panel provided by the present application defines the first recess in the non-display region, and both the portions of the organic light emitting material layer and the encapsulation layer corresponding to the first recess are broken off, cutting cracks can be interrupted when the shape is trimmed and cut. Namely, when OLED display panels with similar shapes commonly employ a mask plate, cracks extending toward a display region are prevented from being easily generated during cutting, which further improves an encapsulation effect of the OLED display panel.

In a second aspect, the electronic apparatus provided by the present application further disposes the second recess between the display region and the first recess, and a portion of the organic light emitting material layer corresponding to the second recess is broken off to further prevent cracks from extending to the display region. In the meantime, a portion of the encapsulation layer corresponding to the second recess is continuous to guarantee the lateral encapsulation effect of the OLED display panel, effectively prevent invasion of water and oxygen through the second recess, and improve reliability of later encapsulation of the display panel.

The display panel and the electronic apparatus provided by the present application are described in detail as above. In the specification, the specific examples are used to explain the principle and embodiment of the present application. The above description of the embodiments is only used to help understand the method of the present application and its spiritual idea. Meanwhile, for those skilled in the art, according to the present the idea of invention, changes will be made in specific embodiment and application. In summary, the contents of this specification should not be construed as limiting the present application.

What is claimed is:

1. An organic light emitting diode (OLED) display panel, comprising:
    a substrate, wherein the substrate comprises a display region and a non-display region disposed outside the display region, and an aperture is defined in the display region; wherein a first recess is defined in the non-display region, and a second recess is defined in a periphery of the aperture and is located between the aperture and the display region;
    an organic light emitting material layer, wherein the organic light emitting material layer is disposed on the substrate, portions of the organic light emitting material layer corresponding to the first recess and the second recess are broken off, and the portion of the organic light emitting material layer broken off and corresponding to the first recess forms two broken end edges spaced from each other oppositely; and
    an encapsulation layer, wherein the encapsulation layer is disposed on the organic light emitting material layer, a portion of the encapsulation layer corresponding to the first recess is broken off to form two broken end portions spaced from each other oppositely, and a portion of the encapsulation layer corresponding to the second recess is continuous;
    wherein two bending covering portions are formed respectively on the broken end portions of the encapsulation layer and at least directly contact and cover the broken end edges of the organic light emitting material layer respectively.

2. The OLED display panel according to claim 1, wherein the substrate comprises
    a base and an insulation layer disposed on the base;
    a first sub-recess is defined in the base, a first via hole is defined in the insulation layer, and the first sub-recess and the first via hole are arranged correspondingly to form the first recess; and
    a second sub-recess is defined in the base, a second via hole is defined in the insulation layer, and the second sub-recess and the second via hole are arranged correspondingly to form the second recess.

3. The OLED display panel according to claim 2, wherein the insulation layer comprises a first extension portion, the first extension portion is disposed right above the first sub-recess, and a ratio of a length of the first extension portion to a depth of the first sub-recess is greater than 1.

4. The OLED display panel according to claim 3, wherein a third sub-recess is defined in a bottom wall of the first sub-recess, and an opening of the third sub-recess is smaller than an opening of the first sub-recess.

5. The OLED display panel according to claim 2, wherein an included angle between a bottom wall of the first sub-recess and a sidewall of the first sub-recess is an acute angle.

6. The OLED display panel according to claim 3, wherein the insulation layer comprises a second extension portion, the second extension portion is disposed right above the second sub-recess, and a ratio of a length of the second extension portion to a depth of the second sub-recess ranges from 0.3 to 0.4.

7. The OLED display panel according to claim 6, wherein an included angle between the second extension portion and a sidewall of the second sub-recess ranges from 75 degrees to 180 degrees.

8. The OLED display panel according to claim 6, wherein the length of the second extension portion is 1 micron, and the depth of the second sub-recess is 3 microns.

9. The OLED display panel according to claim 2, wherein a transistor layer is disposed on the base and comprises a first insulation layer, an active layer, a second insulation layer, a gate electrode, a third insulation layer, a source electrode/drain electrode, and a fourth insulation layer sequentially stacked on one another; wherein the insulation layer comprises the first insulation layer, the second insulation layer, and the third insulation layer.

10. The OLED display panel according to claim 1, wherein a barrier wall structure is disposed on the periphery of the aperture; a number of the second recess located on a side of the barrier wall structure away from the first recess is greater than or equal to 1, and a number of the second recess located on a side of the barrier wall structure near the first recess is greater than or equal to 3.

11. An organic light emitting diode (OLED) display panel, comprising:
    a substrate, wherein the substrate comprises a display region and a non-display region disposed outside the display region, and an aperture is defined in the display region; wherein a first recess is defined in the non-display region, and a second recess is defined in a periphery of the aperture and is located between the aperture and the display region;
    an organic light emitting material layer, wherein the organic light emitting material layer is disposed on the substrate, portions of the organic light emitting material layer corresponding to the first recess and the second recess are broken off, and the portion of the organic light emitting material layer broken off and corresponding to the first recess forms two broken end edges spaced from each other oppositely; and
    an encapsulation layer, wherein the encapsulation layer is disposed on the organic light emitting material layer, a portion of the encapsulation layer corresponding to the first recess is broken off to form two broken end portions spaced from each other oppositely, and a portion of the encapsulation layer corresponding to the second recess is continuous;
    wherein two bending covering portions are formed respectively on the broken end portions of the encapsulation layer and at least directly contact and cover the broken end edges of the organic light emitting material layer respectively;
    wherein the substrate comprises a base and an insulation layer disposed on the base;

wherein a first sub-recess is defined in the base, a first via hole is defined in the insulation layer, and the first sub-recess and the first via hole are arranged correspondingly to form the first recess;

wherein a second sub-recess is defined in the base, a second via hole is defined in the insulation layer, and the second sub-recess and the second via hole are arranged correspondingly to form the second recess; and wherein a barrier wall structure is disposed on the periphery of the aperture; a number of the second recess located on a side of the barrier wall structure away from the first recess is greater than or equal to 1, and a number of the second recess located on a side of the barrier wall structure near the first recess is greater than or equal to 3.

12. The OLED display panel according to claim 11, wherein the insulation layer comprises a first extension portion, the first extension portion is disposed right above the first sub-recess, and a ratio of a length of the first extension portion to a depth of the first sub-recess is greater than 1.

13. The OLED display panel according to claim 12, wherein a third sub-recess is defined in a bottom wall of the first sub-recess, and an opening of the third sub-recess is smaller than an opening of the first sub-recess.

14. The OLED display panel according to claim 11, wherein an included angle between a bottom wall of the first sub-recess and a sidewall of the first sub-recess is an acute angle.

15. The OLED display panel according to claim 12, wherein the insulation layer comprises a second extension portion, the second extension portion is disposed right above the second sub-recess, and a ratio of a length of the second extension portion to a depth of the second sub-recess ranges from 0.3 to 0.4.

16. The OLED display panel according to claim 15, wherein an included angle between the second extension portion and a sidewall of the second sub-recess ranges from 75 degrees to 180 degrees.

17. The OLED display panel according to claim 15, wherein the length of the second extension portion is 1 micron, and the depth of the second sub-recess is 3 microns.

18. The OLED display panel according to claim 11, wherein a transistor layer is disposed on the base and comprises a first insulation layer, an active layer, a second insulation layer, a gate electrode, a third insulation layer, a source electrode/drain electrode, and a fourth insulation layer sequentially stacked on one another; wherein the insulation layer comprises the first insulation layer, the second insulation layer, and the third insulation layer.

* * * * *